United States Patent

Mii et al.

(10) Patent No.: US 6,645,346 B2
(45) Date of Patent: Nov. 11, 2003

(54) WORKPIECE HOLDING DEVICE FOR A BONDING APPARATUS

(75) Inventors: Tatsunari Mii, Tachikawa (JP); Shigeru Shiozawa, Hlgashiyamato (JP); Yoshimitsu Terakado, Hachioji (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 55 days.

(21) Appl. No.: 10/071,654

(22) Filed: Feb. 7, 2002

(65) Prior Publication Data

US 2002/0105130 A1 Aug. 8, 2002

(30) Foreign Application Priority Data

Feb. 8, 2001 (JP) ........................................ 2001-032646

(51) Int. Cl.⁷ ............................................... B30B 15/00
(52) U.S. Cl. ................ 156/583.1; 156/581; 269/254 R
(58) Field of Search ..................... 156/580, 581, 156/583.1; 269/216, 254 R

(56) References Cited

U.S. PATENT DOCUMENTS 5,108,023 A * 4/1992 Japichino et al. ............ 228/6.2
5,549,754 A * 8/1996 Okuhara ..................... 118/500

FOREIGN PATENT DOCUMENTS

| JP | S60-192444 | 12/1985 |
| JP | S2-129729 | 10/1990 |
| JP | H4-262545 | 9/1992 |

* cited by examiner

Primary Examiner—James Sells
(74) Attorney, Agent, or Firm—Koda & Androlia

(57) ABSTRACT

A workpiece retainer used in, for instance, a bonding apparatus for holding a workpiece during bonding being provide with plate springs that are driven towards the workpiece. Before the workpiece is pressed by the retainer, the end portions of plate springs protrude further toward the workpiece than the retaining surface of the workpiece retainer. When the workpiece is pressed by the retainer, the plate springs undergo elastic deformation and are pulled in the direction opposite from the workpiece so that the workpiece is pressed against a heat block by the retaining surface of the workpiece retainer; and when the workpiece is conveyed, the workpiece retainer is separated from the workpiece by a predetermined distance so that the plate springs undergo elastic recovery, thus preventing the workpiece from contacting the workpiece retainer.

4 Claims, 5 Drawing Sheets

WORKPIECE HOLDING DEVICE FOR A BONDING APPARATUS

BACKGROUND OF THE INVENTION

1. Field of the Invention

The present invention relates to a workpiece holding device for a bonding apparatus which holds a workpiece such as a lead frame, film or substrate, etc. in place by pressing such a workpiece against a heat block by means of a workpiece retainer.

2. Prior Art

Generally, in a bonding apparatus, a workpiece is held in place by being pressed against a heat block by a workpiece retainer, and bonding such as die bonding, wire bonding, etc. is then performed on the workpiece. However, the workpiece is heated by a heat bloc; and as a result, it may undergo thermal deformation such as warping, bending, etc.

Japanese Utility Model Application Laid-Open (Kokai) No. S60-192444 (hereafter referred to as Example 1) and Japanese Utility Model Application Laid-Open (Kokai) No. 2-129729 (hereafter referred to as Example 2) disclose bonding apparatuses equipped with means for correcting thermal deformation of the workpiece. In these bonding apparatuses, the workpiece retainer that presses the workpiece against the heat block is equipped with a workpiece pressing means that is driven toward the workpiece so that the driving means is pressed against the workpiece.

In Example 1, two retaining portions are respectively disposed in each of the peripheral edges of the workpiece retainer on two opposite sides of a bonding window (through-hole) of the retainer. Each of the retaining portions has a plate spring which is installed horizontally so as to protrude into the interior of the bonding window, and a claw body with a tapered portion which is superimposed on the plate spring and fastened to the workpiece retainer. The plate spring bends upward in an elastic manner.

In Example 2, numerous retaining pins are installed to protrude from the workpiece retainer (frame body) via plate springs in positions near the periphery of the workpiece so that these pins can advance and retract.

In Examples 1 and 2, the spring plates (Example 1) or retaining pins (Example 2) must be sufficiently raised so that these parts do not contact the workpiece (which has undergone thermal deformation as a result of being heated) during the conveying of the workpiece. If the amount by which these parts are raised is excessively large, the vertical stroke loss is high, and productivity drops. Accordingly, in order to minimize the vertical stroke, the amount of thermal deformation of the workpiece must be checked at the time of product changeover, and the vertical stroke of the workpiece retainer must be adjusted on a case-by-case basis. Considerable time is, however, required for this adjustment.

Furthermore, in Example 1, when the workpiece is lifted by the heat block, the plate springs contact the peripheral edges of the workpiece, and the workpiece is clamped by the heat block and the plate springs. As a result, only the portions of the workpiece where the plate springs are present are pressed against the heat block. In other words, not the entire periphery of the workpiece come into contact with the heat block along the bonding window of the workpiece retainer. In Example 2, the portions of the workpiece that are pressed are the portions where the retaining pins are present. Accordingly, numerous retaining pins and plate springs are required in order to cause the entire periphery of the workpiece to come into contact tightly with the heat block along the bonding window of the workpiece retainer, so that the number of parts required is high, thus causing the apparatus to be expensive.

SUMMARY OF THE INVENTION

Accordingly, one object of the present invention is to provide a workpiece holding device for a bonding apparatus in which the vertical stroke of a workpiece retainer can be set in accordance with the type of the workpiece to be processed, thus allowing high-speed operation and being able to respond to thermal deformation of the workpiece.

Another object of the present invention is to provide a workpiece holding device for a bonding apparatus in which, with a small number of elements, thermal deformation of the workpiece is corrected, and the entire periphery of the workpiece is brought to contact the heat block along the bonding window of the workpiece retainer.

The above objects are accomplished by a unique structure for a workpiece holding device used in a bonding apparatus that includes a heat block, a workpiece retainer for pressing a workpiece against the heat block, and a workpiece pressing means which is provided in the workpiece retainer and driven toward workpiece so as to be pressed against the workpiece; and in the present invention:

- before the workpiece is pressed by the workpiece pressing means, end portions of the workpiece pressing means which face the workpiece protrude further toward the workpiece than a retaining surface of the workpiece retainer,
- when the workpiece is being pressed by the workpiece retainer, the workpiece pressing means undergoes elastic deformation and is pulled in a direction opposite from the workpiece so that the workpiece is pressed against the heat block by the retaining surface of the workpiece retainer, and
- when the workpiece is being conveyed, the retaining surface of the workpiece retainer is separated from the workpiece by a predetermined distance so that the workpiece pressing means undergoes elastic recovery, thus preventing the workpiece from contacting the workpiece retainer.

In the above structure, the workpiece pressing means is formed of an elastic material.

Also, the tip end of the elastic material is comprised of a member that can slip easily or has a shape that allows easy slipping.

The workpiece pressing means can be comprised of a pressing member provided in the workpiece retainer and a roller provided at one end of the pressing member so that the roller is rotatable in a direction in which the workpiece is conveyed.

DETAILED DESCRIPTION OF THE INVENTION

Figure 1A:
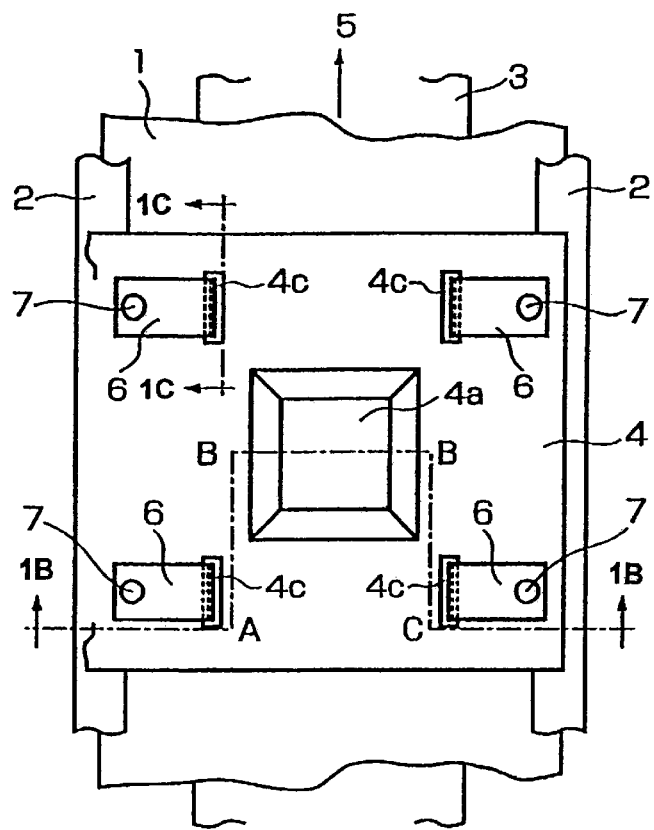
FIG. 1A is a top view of the first embodiment of the workpiece holding device for a bonding apparatus according to the present invention.

One embodiment of the present invention will be described with reference to FIGS. 1 and 2.

A heat block 3 is disposed between work guides 2 that guide the workpiece 1. A workpiece retainer 4 is disposed above the heat block 3 in the bonding position. A bonding window 4a is formed in the workpiece retainer 4, and a retaining surface 4b which protrudes along the periphery of the bonding window 4a is formed on the undersurface of the bonding window 4a. The heat block 3 and workpiece retainer 4 are driven in mutually opposite directions as disclosed, for instance, in Japanese Patent No. 3094374 (Laid-Open No. H4-262545). In other words, during bonding, the heat block 3 is raised and the workpiece retainer 4 is lowered, so that the workpiece 1 is held in place; and during conveying of the workpiece, the heat block 3 is lowered and the workpiece retainer 4 is raised, thus allowing the workpiece to be released.

Through-holes 4c which extend in the conveying direction 5 of the workpiece 1 are formed on the outside of the four corners of the bonding window 4a of the workpiece retainer 4 so as to positionally correspond to the peripheral edges of the workpiece 1. In addition, as best seen from FIG. 1B, L-shaped plate springs 6 which possess an elastic force are inserted into these through-holes 4c, and the upper end portions of these plate springs 6 are fastened to the upper surface of the workpiece retainer 4 by screws 7. Curved surfaces 6a are formed, as seen from FIG. 1C, in the conveying direction 5 of the workpiece 1 at the end portions of the plate springs 6 that are located on the workpiece (1) retaining side or are located so as to face the workpiece 1. The lower ends of the curved surfaces 6a protrude further toward the workpiece 1 than the retaining surface 4b as best seen from FIG. 1B.

The operation of the above embodiment will be described below.

In the workpiece 1, warping, bending, etc. occur as a result of the heat emitted from the heat block 3, and thus the workpiece 1 is bent upward. As described above, the curved surfaces 6a at the tip ends of the plate springs 6 protrude further toward the workpiece 1 than the retaining surface 4b of the workpiece retainer 4 as seen from FIG. 1B. Accordingly, the workpiece 1 contacts the curved surfaces 6a of the plate springs 6 and does not contact the retaining surface 4b of the workpiece retainer 4. In this state, the bonding portions of the workpiece 1 are conveyed to the bonding position by a feeder (not shown). In cases where there is little warping in the workpiece 1, the workpiece 1 is conveyed to the bonding position without the curved surfaces 6a of the plate springs 6 contacting the workpiece 1.

During above conveying of the workpiece, the workpiece 1 lightly contacts the plate springs 6; however, since the tip ends of the plate springs 6 are curved, no scratching would occur on the surface of the workpiece 1. Furthermore, since the retaining surface 4b of the workpiece retainer 4 is separated from the workpiece 1 by a predetermined distance, no damage would occur to the bonded wires or semiconductor chips on the workpiece 1.

When a bonding portion of the workpiece 1 is moved to the bonding position and positioned at the bonding position, the workpiece retainer 4 is lowered by a driving means (not shown), and the heat block 3 is raised by a driving means (not shown). In this case, the force with which the workpiece 1 is pressed by the workpiece retainer 4 (approximately 4 kgf) is stronger than the driving force of the plate springs 6; accordingly, the plate springs 6 elastically deform and are pushed into the workpiece retainer 4 as shown in FIG. 2. As a result, the workpiece 1 is pressed against the heat block 3 by the retaining surface 4b of the workpiece retainer 4. In other words, the entire periphery of the workpiece 1 along the bonding window 4a of the workpiece retainer 4 is caused to come into contact tightly with the heat block 3 by the retaining surface 4b.

Figure 2:
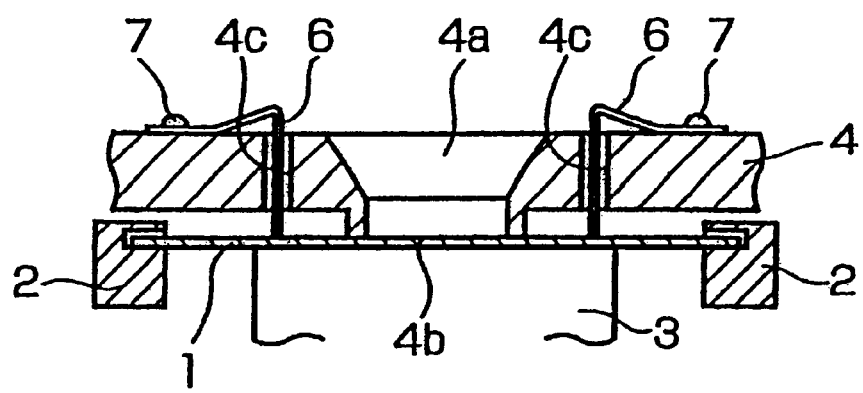
FIG. 2 is a sectional view similar to FIG. 1B, showing the state in which the workpiece is held in place.

In the state shown in FIG. 2, bonding is performed on the workpiece 1 by the bonding tool of a bonding apparatus (not shown).

Following the completion of bonding, the workpiece retainer 4 is raised and the heat block 3 is lowered, and the workpiece 1 is released. In this case, the plate springs 6 that are in a elastically deformed form as shown in FIG. 2 undergo elastic recovery, and the curved surfaces 6a of the plate springs 6 protrude further toward the workpiece 1 than the retaining surface 4b of the workpiece retainer 4. As a result, the curved portions of the workpiece 1 are lightly pressed by the curved surfaces 6a of the plate springs 6, and the retaining surface 4b is separated from the workpiece 1. Accordingly, the workpiece 1 is conveyed by one pitch with no contact between the retaining surface 4b and the workpiece 1.

Afterward, the above-described operation is repeated.

Figure 1B:
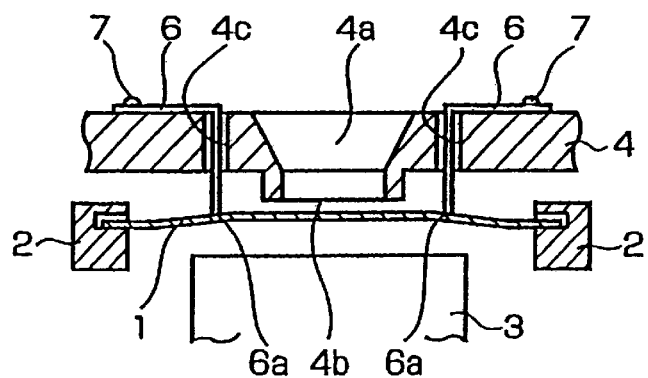
FIG. 1B is a cross sectional view taken along the line 1B—1B in FIG. 1A.

When the workpiece retainer 4 is raised to the state shown in FIG. 1B from the state shown in FIG. 2, the curved surfaces 6a at the tip ends of the plate springs 6 protrude further toward the workpiece 1 than the retaining surface 4b of the workpiece retainer 4 as described above. Accordingly, the workpiece 1 contacts the curved surfaces 6a of the plate springs 6 so that the retaining surface 4b is separated from the workpiece 1. In other words, the vertical stroke of the workpiece retainer 4 can be set in accordance with the type of the workpiece 1. Furthermore, thermal deformation of the workpiece 1 can be well handled case by case without any need to adjust or alter the vertical stroke. Moreover, since the tip ends of the plate springs 6 are formed as curved surfaces 6a, no scratches occur in the workpiece 1 by the plate springs 6 during the conveying of the workpiece 1, even if the plate springs 6 contact the workpiece 1.

Figure 3:
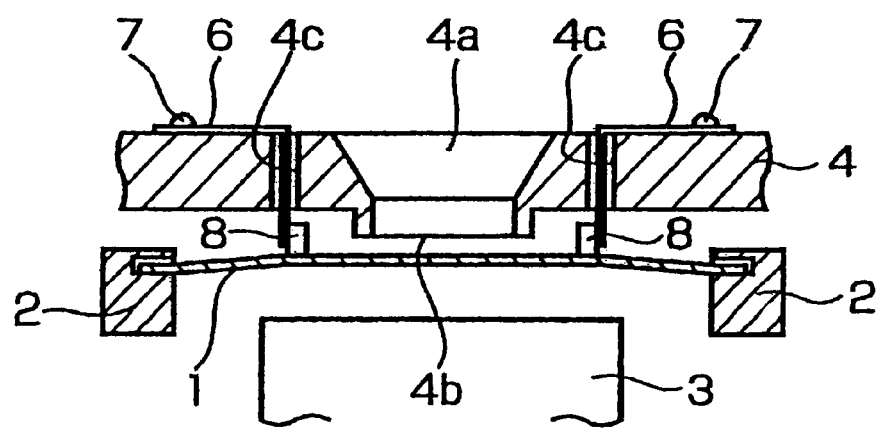
FIG. 3 is a sectional view similar to FIG. 1B, showing the second embodiment of the present invention.

FIG. 3 illustrates the second embodiment of the present invention.

In the embodiment shown in FIGS. 1 and 2, the workpiece contacting surfaces of the plate springs 6 are formed as curved surfaces 6a. In the embodiment of FIG. 3, rollers 8 are rotatably provided on the workpiece (1) sides of the plate springs 6 or rotatably provided at the tip ends of the plate springs 6 that face the workpiece 1 instead of the curved surfaces 6a. More specifically, the rollers 8 are installed on the plate springs 6 so that these rollers 8 are free to rotate in the conveying direction 5 (see FIG. 1A) of the workpiece 1.

Figure 1C:
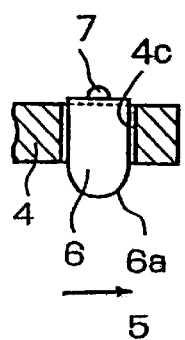
FIG. 1C is a sectional view taken along the line 1C—1C in FIG. 1A.

Effects substantially the same as those of the above-described embodiment of FIGS. 1A through 1C are obtained using the second embodiment as well. Furthermore, though not shown, it is also possible to attach members made of a material that allows easy slipping to the tip end portions of the plate springs 6.

Figure 4A:
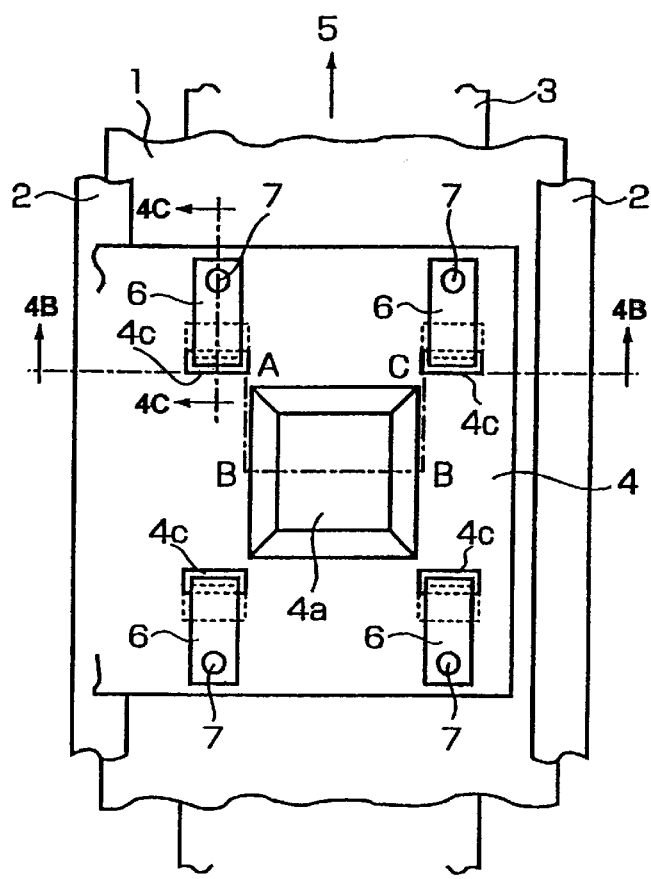
FIG. 4A is a top view of the third embodiment of the workpiece holding device for a bonding apparatus according to the present invention.
Figure 4B:
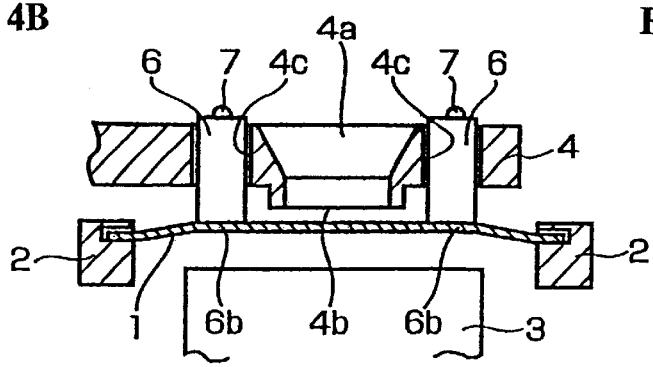
FIG. 4B is a cross sectional view taken along the line 4B—4B in FIG. 4A.
Figure 4C:
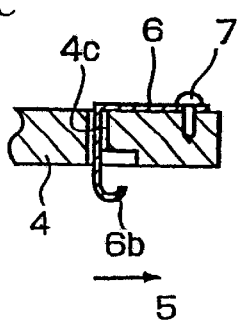
FIG. 4C is a sectional view taken along the line 4C—4C in FIG. 4A.

FIGS. 4A, 4B and 4C illustrate the third embodiment of the present invention.

Elements which are the same as those in the respective embodiments described above or which correspond to such elements are labeled with the same symbols, and a detailed description of such elements is omitted. In the above embodiments, the through-holes 4c are formed in the workpiece retainer 4 so as to extend in the conveying direction 5 of the workpiece 1. In the third embodiment, as best seen from FIG. 4A, the through-holes 4c are formed so as to extend at right angles to the conveying direction 5 of the workpiece 1, and curved sections 6b which are bent into a curve in the conveying direction 5 of the workpiece 1 are formed on the tip ends of the plate springs 6 (so as to be on the workpiece (1) side). Effects substantially the same as those of the previous embodiments described above are obtainable using the construction of FIGS. 4A through 4C.

FIGS. 5A, 5B, 6A and 6B illustrate the fourth embodiment of the present invention.

In this embodiment, the workpiece retainer 4 is provided with the bonding window 4a, and the retaining surface 4b that protrudes along the periphery of the bonding window 4a is formed on the undersurface of the bonding window 4a. In addition, two spring mounting grooves 4d which extend parallel to the conveying direction 5 of the workpiece 1 are formed in the workpiece retainer 4 so as to be located on both the left and right sides of the bonding window 4a. Two roller shaft installation grooves 4e which extend at right angles to the spring mounting grooves 4d are formed on the front and rear sides of the bonding window 4a with reference to the workpiece conveying direction 5. Four through-holes 4f that extend in the conveying direction 5 are formed in the roller shaft installation grooves 4e so as to positionally correspond to the peripheral edges of the workpiece 1.

On roller shafts 10 which are disposed in the roller shaft installation grooves 4e, rollers 11 are rotatably coupled so that the rollers 11 are in the through-holes 4f. When the roller shafts 10 are carried in the roller shaft installation grooves 4e so that the rollers 11 are aligned with the through-holes 4f, the lower ends of the rollers 11 (on the workpiece side) protrude further toward the workpiece 1 than the retaining surface 4b. Spacers 12 are set in the centers of the spring mounting grooves 4d, and plate springs 13 are inserted in the spring mounting grooves 4d so as to be on the roller shafts 10 and spacers 12. When the centers of the plate springs 13 are fastened to the workpiece retainer 4 via the spacers 12 by screws 14, the driving force of the plate springs 13 acts on the roller shafts 10 in the direction toward the workpiece 1.

Figure 5A:
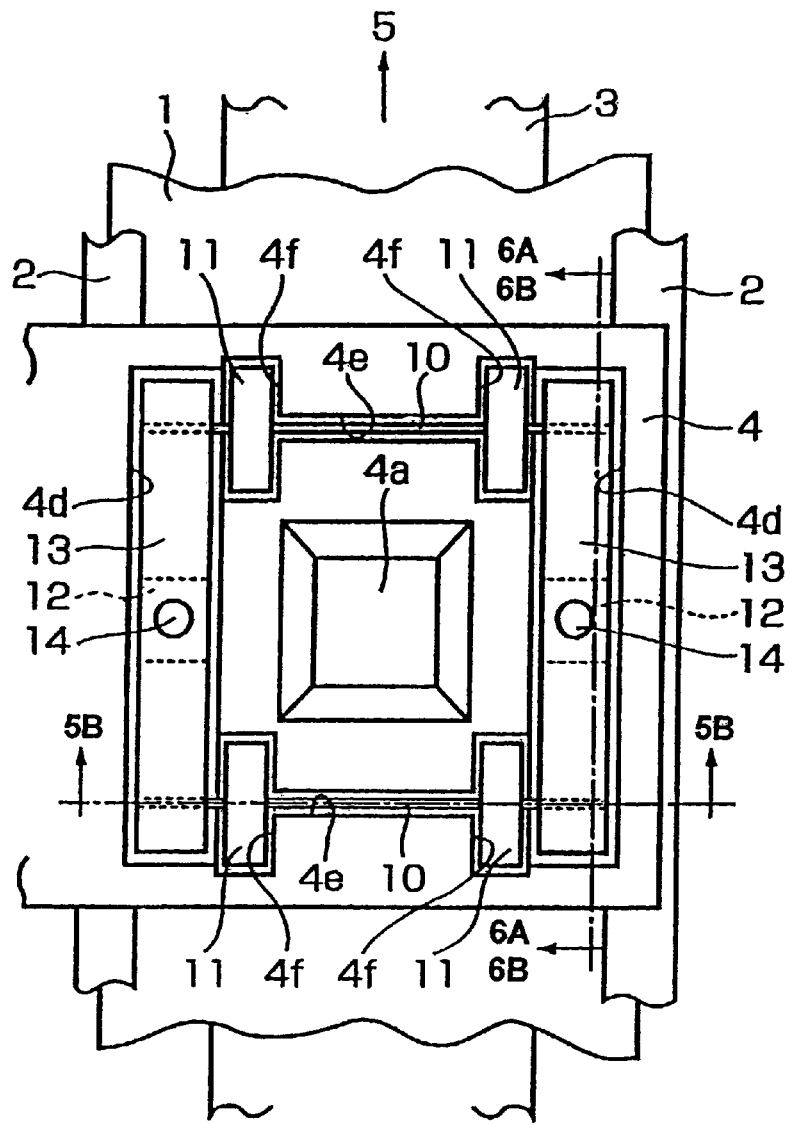
FIG. 5A is a top view of the fourth embodiment of the workpiece holding device for a bonding apparatus according to the present invention.
Figure 5B:
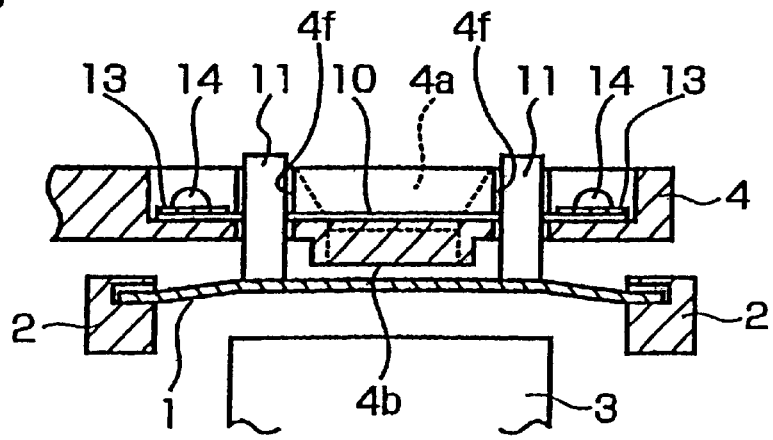
FIG. 5B is a cross sectional view taken along the line 5B—5B in FIG. 4A.
Figure 6A:
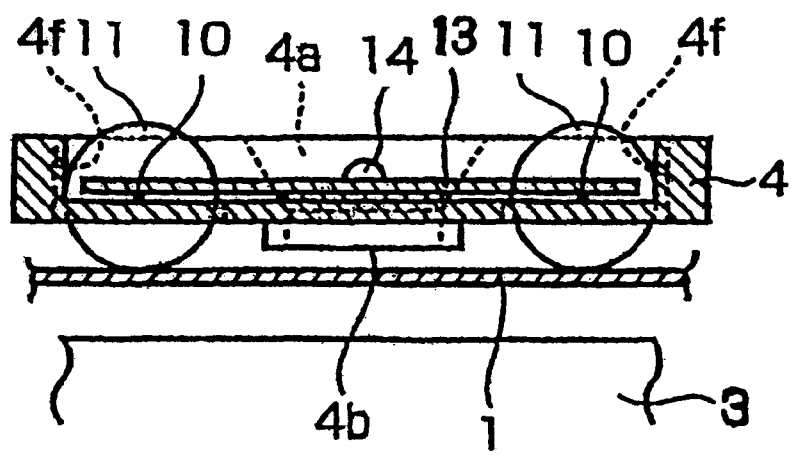
FIGS. 6A and 6B are sectional views taken along the line 6A,6B—6A,6B in FIG. 5A, FIG. 6A showing the state in which the workpiece is conveyed, and FIG. 6B showing the in which the workpiece is held in place.

With the above structure, the lower ends of the rollers 11 protrude further toward the workpiece 1 than the retaining surface 4b of the workpiece retainer 4. Accordingly, the workpiece 1 contacts the rollers 11 and is prevented from contacting the retaining surface 4b of the workpiece retainer 4 as shown in FIGS. 5B and 6A. The bonding portion of the workpiece 1 is conveyed in this state to the bonding position by a feeder (not shown). During this convey of the workpiece 1, the workpiece 1 contacts the rollers 11; however, since the rollers 11 rotate, there is no scratching occurs in the workpiece 1. Furthermore, since the retaining surface 4b of the workpiece retainer 4 is not in contact with the workpiece 1 by a predetermined distance, the bonded wires or semiconductor chips are not damaged.

Figure 6B:
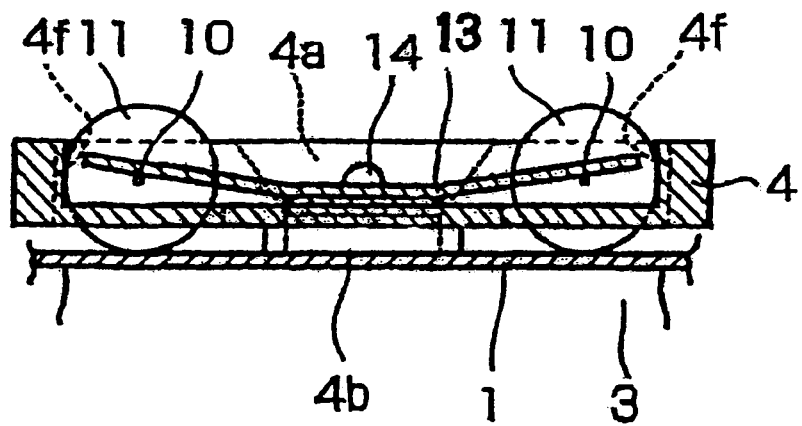

When the bonding portion of the workpiece 1 is conveyed to the bonding position and positioned in this bonding position, the workpiece retainer 4 is lowered by a driving means (not shown), and the heat block 3 is raised by a driving means (not shown). The force with which the workpiece 1 is pressed by the workpiece retainer 4 is stronger than the driving force of the plate springs 13; accordingly, the plate springs 13 are elastically deformed, and the rollers 11 are pushed into the workpiece retainer 4 as shown in FIG. 6B. As a result, the workpiece 1 is pressed against the heat block 3 by the retaining surface 4b of the workpiece retainer 4. In other words, the entire periphery of the workpiece 1 along the bonding window 4a of the workpiece retainer 4 is caused to come into contact tightly with the heat block 3 by the retaining surface 4b.

In the state shown in FIG. 6B, bonding is performed on the workpiece 1 by the bonding tool of a bonding apparatus (not shown).

Following the completion of bonding, the workpiece retainer 4 is raised and the heat block 3 is lowered. The workpiece 1 is thus released. In this case, the plate springs 13 which has been elastically deformed as shown in FIG. 6B undergo elastic recovery, and the lower ends of the rollers 11 protrude further toward the workpiece 1 than the retaining surface 4b of the workpiece retainer as shown in FIGS. 5B and 6A. As a result, the retaining surface 4b of the workpiece retainer 4 is separated from the workpiece 1, and the rollers 11 prevent the retaining surface 4b from contacting the workpiece 1.

Subsequently, the above-described operation is repeated.

In the embodiment shown in FIGS. 5A through 6B, as in the respective embodiments described above, when the workpiece retainer 4 is raised from the state shown in FIG. 6B to the state shown in FIGS. 5B and 6A, the lower ends of the rollers 11 further protrude toward the workpiece 1 than the retaining surface 4b of the workpiece retainer 4 as described above. Accordingly, even in a state in which the workpiece 1 contacts the rollers 11, the retaining surface 4b is separated from the workpiece 1. In other words, the vertical stroke of the workpiece retainer 4 can be set at a small value. In addition, thermal deformation of the workpiece 1 can be well handled without any need to adjust or alter the vertical stroke. Moreover, even if the rollers 11 contact the workpiece 1, since the rollers 11 rotate during the conveying of the workpiece, no scratching occurs in the workpiece 1.

As seen from the above, in the present invention, the end portion of the workpiece pressing means protrudes further toward the workpiece than the retaining surface of the workpiece retainer before the workpiece is pressed. When the workpiece is being pressed, the workpiece pressing means undergoes elastic deformation and is pulled in the opposite direction from the workpiece so that the workpiece is pressed against the heat block by the retaining surface of the workpiece retainer, and when the workpiece is being conveyed, the workpiece retainer is separated from the workpiece by a predetermined distance so that the workpiece pressing means undergoes elastic recovery, thus preventing the workpiece from contacting the workpiece retainer.

Furthermore, in workpiece retainer is separated from the workpiece by a predetermined distance, thus preventing the workpiece pressing means from contacting the workpiece retainer.

With the structures above, the vertical stroke of the workpiece retainer can be set in accordance with the type of workpiece to be processed, and high-speed operation can be achieved. Furthermore, thermal deformation of the workpiece can be well handled flexibly, and such thermal deformation of the workpiece can be corrected with a small number of components. In addition, the entire periphery of the workpiece along the bonding window of the workpiece retainer is caused to come into contact tightly with the heat block.

What is claimed is:

1. A workpiece holding device used in a bonding apparatus that includes a heat block, a workpiece retainer for pressing a workpiece against said heat block, and a workpiece pressing means which is provided in said workpiece retainer and driven toward workpiece so as to be pressed against said workpiece, wherein said workpiece holding device is provided so that:

before said workpiece is pressed by said workpiece retainer, an end portion of said workpiece pressing means which faces said workpiece protrudes further toward said workpiece than a retaining surface of said workpiece retainer, while said workpiece is being pressed by said workpiece pressing means, said workpiece pressing means undergoes elastic deformation and said end portion is pulled in a direction opposite from said workpiece so that said workpiece is pressed against said heat block by said retaining surface of said workpiece retainer, and while said workpiece is being conveyed, said retaining surface of said workpiece retainer is separated from said workpiece by a predetermined distance so that said workpiece pressing means undergoes elastic recovery, thus preventing said workpiece from contacting said workpiece retainer.

2. The workpiece holding device for a bonding apparatus according to claim 1, wherein said workpiece pressing means is formed of an elastic material.

3. The workpiece holding device for a bonding apparatus according to claim 2, wherein a tip end of said elastic material is comprised of a member that slips easily or has a shape which allows easy slipping.

4. The workpiece holding device for a bonding apparatus according to claim 1, wherein said workpiece pressing means is comprised of:

a pressing member provided in said workpiece retainer, and a roller provided at one end of said pressing member so as to be rotatable in a direction in which said workpiece is conveyed.

* * * * *